United States Patent
Kawa et al.

(10) Patent No.: US 11,973,497 B1
(45) Date of Patent: Apr. 30, 2024

(54) PARAMETERIZED SUPERCONDUCTING MULTI-ROW CIRCUIT

(71) Applicant: Synopsys, Inc., Mountain View, CA (US)

(72) Inventors: Jamil Kawa, Campbell, CA (US); Stephen Robert Whiteley, Sunnyvale, CA (US); Eric M. Mlinar, Santa Clara, CA (US)

(73) Assignee: Synopsys, Inc., Sunnyvale, CA (US)

( * ) Notice: Subject to any disclaimer, the term of this patent is extended or adjusted under 35 U.S.C. 154(b) by 28 days.

(21) Appl. No.: 18/050,187

(22) Filed: Oct. 27, 2022

Related U.S. Application Data (60) Provisional application No. 63/272,976, filed on Oct. 28, 2021.

(51) Int. Cl.
*H03K 17/92* (2006.01)
*H03K 3/037* (2006.01)

(52) U.S. Cl.
CPC ............. *H03K 17/92* (2013.01); *H03K 3/037* (2013.01)

(58) Field of Classification Search
CPC ...................................................... H03K 17/92
See application file for complete search history.

(56) References Cited

U.S. PATENT DOCUMENTS

| | | | |
|---|---|---|---|
| 10,769,344 B1* | 9/2020 | Schneider | H03K 19/1952 |
| 2017/0017742 A1* | 1/2017 | Oberg | G06F 30/3312 |
| 2022/0374754 A1* | 11/2022 | Ni | G06N 10/20 |

* cited by examiner

*Primary Examiner* — Patrick O Neill
(74) *Attorney, Agent, or Firm* — Park, Vaughan, Fleming & Dowler LLP; Laxman Sahasrabuddhe (57) ABSTRACT

A parameterized superconducting circuit may include a set of sub-blocks which include superconducting circuitry. Different sub-blocks in the set of sub-blocks may be clocked using clock signals having different phases. Along a first direction, relative locations of the set of sub-blocks may be fixed. Along a second direction, relative locations of the set of sub-blocks may be determined based on a set of parameter values.

20 Claims, 5 Drawing Sheets

PARAMETERIZED SUPERCONDUCTING MULTI-ROW CIRCUIT

RELATED APPLICATION

This application claims the benefit of U.S. Provisional Application Ser. No. 63/272,976, filed on 28 Oct. 2021, the contents of which are herein incorporated by reference in their entirety for all purposes.

TECHNICAL FIELD

The present disclosure generally relates to superconducting electronics (SCE). More specifically, the present disclosure relates to a parameterized superconducting multi-row circuit.

BACKGROUND

An increasing demand for computing and storage capacity has fueled an increase in the size and complexity of integrated circuit (IC) designs. SCE is a technology that may help meet future computing and storage demands.

SUMMARY

Embodiments described herein may feature a parameterized superconducting circuit, which may include a set of sub-blocks comprising superconducting circuitry. Different sub-blocks in the set of sub-blocks may be clocked using clock signals having different phases. Along a first direction, relative locations of the set of sub-blocks may be fixed. Along a second direction (which may be perpendicular to the first direction), relative locations of the set of sub-blocks may be determined based on a set of parameter values. Each placement row has a width along the first direction and a height along the second direction, where the width of the placement row is greater than the height of the placement row. In some embodiments described herein, the set of sub-blocks may implement a flip-flop.

In some embodiments described herein, a circuit design area may be partitioned into a set of placement rows, where each sub-block in the set of sub-blocks may be placed in a different placement row. Each parameter value in the set of parameter values may correspond to a distance between a respective pair of sub-blocks. The lengths of connections between the sub-blocks may be resized based on the set of parameter values. In some embodiments described herein, each sub-block may be a hard macro.

In some embodiments described herein, the set of sub-blocks may include quantum-flux-parametron (QFP) circuitry. In some embodiments described herein, the set of sub-blocks may include dynamic single-flux-quantum (DSFQ) circuitry. In some embodiments described herein, the set of sub-blocks may include adiabatic quantum-flux-parametron (AQFP) circuitry. In some embodiments described herein, the set of sub-blocks may include reciprocal quantum logic (RQL) circuitry.

In some embodiments described herein, a timing model for the parameterized superconducting circuit may use the set of parameters to compute a delay value between an input and an output of the parameterized superconducting circuit.

In some embodiments described herein a first timing model may be received corresponding to a first parameterized superconducting circuit which may include a set of sub-blocks. Along a first direction, relative locations of the set of sub-blocks within the first parameterized superconducting circuit may be fixed. Along a second direction, relative locations of the set of sub-blocks within the first parameterized superconducting circuit may be determined based on a first set of parameter values. The first timing model may assume that each parameter value in the first set of parameter values is zero. A second set of parameter values may be received corresponding to a second parameterized superconducting circuit. Timing compensation values may be computed based on the second set of parameter values. The timing values for a second timing model corresponding to the second parameterized superconducting circuit may be computed based on the timing values in the first timing model and the timing compensation values.

BRIEF DESCRIPTION OF THE FIGURES

The disclosure can be understood based on the detailed description given below and the accompanying figures. The figures, examples and embodiments are for illustrative purposes, and do not limit the scope of the disclosure. Furthermore, the figures are not necessarily drawn to scale.

DETAILED DESCRIPTION

Aspects of the present disclosure relate to a parameterized superconducting multi-row circuit.

SCE may generally refer to electronic circuits which include active and/or passive components, and which are intended to be operated below a critical temperature, where at least some of the components exhibit superconducting behavior.

AQFP is an energy efficient logic family of SCE, with an energy consumption of approximately $10^{-21}$ Joules per operation (which is many orders of magnitude less than the $10^{-14}$ Joules per operation energy consumption that is typical for complementary metal-oxide-semiconductor circuits). AQFP circuits are typically driven using multi-phase clocking and may require precise timing between logic gates. Other SCE technologies that may require precise timing between logic gates include, but are not limited to, quantum-flux-parametron (QFP) technology and reciprocal quantum logic (RQL) technology.

A place-and-route system (e.g., a software application executing on a computer system) may be used for placing cells and/or routes connections between cells. To meet design constraints, the place-and-route system typically requires flexibility to determine where to place cells and how to route connections between cells. Some approaches for designing SCE circuits may not ensure precise timing between logic gates while also providing placement and routing flexibility.

Embodiments described herein feature a parameterized superconducting circuit which can ensure precise timing between logic gates while also providing placement and routing flexibility. Technical advantages of embodiments described herein include, but are not limited to, improving the performance of SCE circuits and improving the quality of results produced by a place-and-route system, for example a place-and-route application executed by a processor. A place-and-route system may be used to place SCE cells and route connections between the SCE cells. The parameterized superconducting multi-row circuit may provide flexibility during placement and routing because the relative locations of the set of sub-blocks along a second direction are determined based on the set of inter-row parameters, which may be modified as desired. In other words, the set of inter-row parameters associated with a parameterized AQFP multi-row cell may provide flexibility (e.g., by selecting desired parameter values) to the place-and-route system to place the SCE cells, which may improve the quality of results produced by the place-and-route system and reduce the amount of time required by the place-and-route system to determine a circuit design that satisfies a desired set of constraints.

SCE circuits may use Josephson junctions and may rely on quantum mechanical quantization of magnetic flux. A Josephson junction (JJ) may include two superconducting structures separated by a non-superconducting structure. In this disclosure, the non-superconducting structure that separates two superconducting structures may be referred to as a junction. In a JJ, the junction may support a current that may flow indefinitely without any voltage being applied across the junction. Examples of superconducting materials which may be used to construct a superconducting structure include, but are not limited to, aluminum (Al), niobium (Nb), and lead (Pb). In some embodiments, a non-superconducting structure may be a thin insulating tunnel barrier that is made of aluminum/aluminum oxide (Al/AlOx). In other embodiments, a non-superconducting structure may be made of a conducting material, such as silver (Ag), copper (Cu), or gold (Au), that does not exhibit superconductivity at low temperatures. In yet other embodiments, a non-superconducting structure may be a multilayered structure that may include one or more magnetic, non-magnetic, insulating, conducting, or ferromagnetic layers. In some embodiments, the non-superconducting structure is made of a superconducting material that has defects (which may have been intentionally introduced into the superconducting material by using a suitable technique, e.g., an electron beam), which prevent superconductivity at low temperatures.

Figure 1:
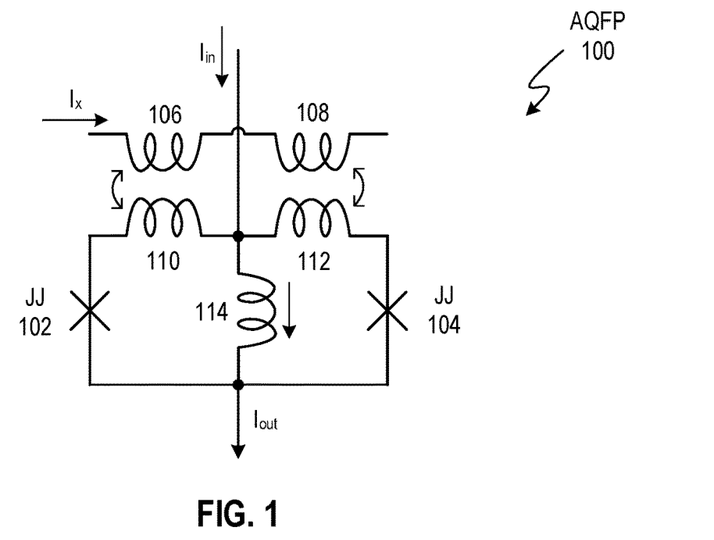
FIG. 1 illustrates an AQFP circuit.

FIG. 1 illustrates an AQFP. AQFP 100 includes JJs 102 and 104, and superconducting inductors 106, 108, 110, 112, and 114. AQFP 100 includes (1) a clockwise loop formed by superconducting inductors 114, 112, and JJ 104, and (2) an anti-clockwise loop formed by superconducting inductors 114, 110, and JJ 102. Superconducting inductors 106 and 110 may be inductively coupled, and superconducting inductors 108 and 112 may be inductively coupled. In FIG. 1, the input current, the output current, and the excitation current are denoted by $I_{in}$, $I_{out}$, and $I_x$, respectively.

When an external flux is applied to AQFP 100 by supplying an excitation current $I_x$, a current is induced in AQFP 100 such that the flux due to the induced current may cancel the applied external flux. Due to the phase matching condition required by the superconducting wave function, the flux due to the induced current may appear in the clockwise loop (i.e., superconducting inductors 114, 112, and JJ 104) or the anti-clockwise loop (i.e., superconducting inductors 114, 110, and JJ 102), but not both. Thus, AQFP 100 is bistable, and the input current $I_{in}$ may determine which loop the flux appears in. When the excitation current $I_x$ is removed, all loop currents may revert to zero.

Figure 2:
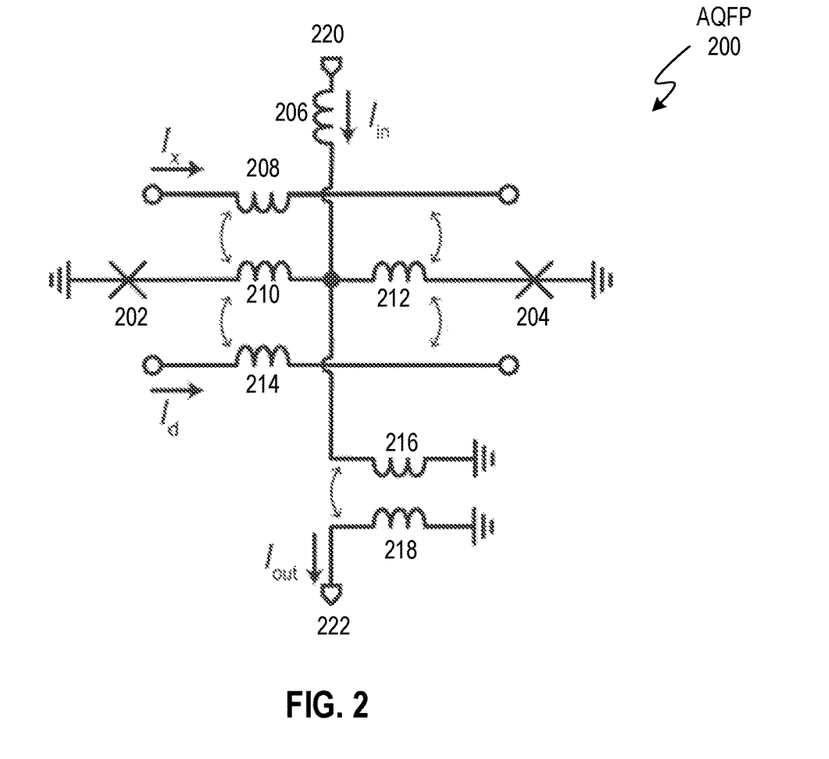
FIG. 2 illustrates another AQFP circuit.

FIG. 2 illustrates another AQFP. AQFP 200 includes JJs 202 and 204, and superconducting inductors 206, 208, 210, 212, 214, 216, and 218. AQFP 200 includes (1) a first loop formed by superconducting inductors 210 and 216, and JJ 202, and (2) a second loop formed by superconducting inductors 212 and 216, and JJ 204. In FIG. 2, the input current, the output current, the DC current, and the excitation current are denoted by $I_{in}$, $I_{out}$, $I_d$, and $I_x$, respectively. The input data (which may be represented by input current $I_{in}$) may be provided at port 220, and the output data (which may be represented by output current $I_{out}$) may be outputted at port 222. The polarity of the mutual inductance between superconducting inductors 216 and 218 may determine whether the output current $I_{out}$ is inverted.

When an external flux is applied to AQFP 200 by supplying current $(I_x+I_d)$, where h is the excitation current and $I_d$ is a direct current (DC) current, a current may be induced in AQFP 200 such that the flux due to the induced current cancels the applied flux. Due to the phase matching condition required by the superconducting wave function, the flux due to the induced current may appear in the first loop or the second loop, but not both. Therefore, AQFP 200 is bistable, and the input current $I_{in}$ may determine which loop the flux appears in. When the current $(I_x+I_d)$ is removed, all loop currents revert to zero.

AQFP circuits (e.g., an AQFP-based flip-flop) are typically driven using multi-phase clocking, e.g., 4-phase clocking, to propagate logic state and improve throughput. Specifically, a single-phase AQFP clocking scheme is non-functional. At least three phases are required, where each pair of adjacent phases provides an overlap sufficient for activation, and the sequencing of the activation of the at least three phases causes the state to propagate in a well-defined direction in the AQFP circuit. An AQFP circuit which uses multi-phase clocking may be viewed as having multiple rows of logic gates, where consecutive rows are clocked using clock signals with consecutive phases.

Logic gates may be constructed using AQFPs, which may be clocked using clock signals having different phases. The input and output of AQFP may be $I_{in}$ and $I_{out}$, respectively (e.g., $I_{in}$ and $I_{out}$ in AQFP 200). Let a, b, and c be three inputs, and let z be the output. A majority gate may be defined by the logic function z=ab+bc+ca and may be constructed by electrically coupling the outputs of three AQFPs to generate the output of the majority gate, where currents corresponding to the logic values a, b, and c are provided to the inputs of the three AQFPs, respectively. Likewise, other logic may also be created using AQFPs.

Figure 3:
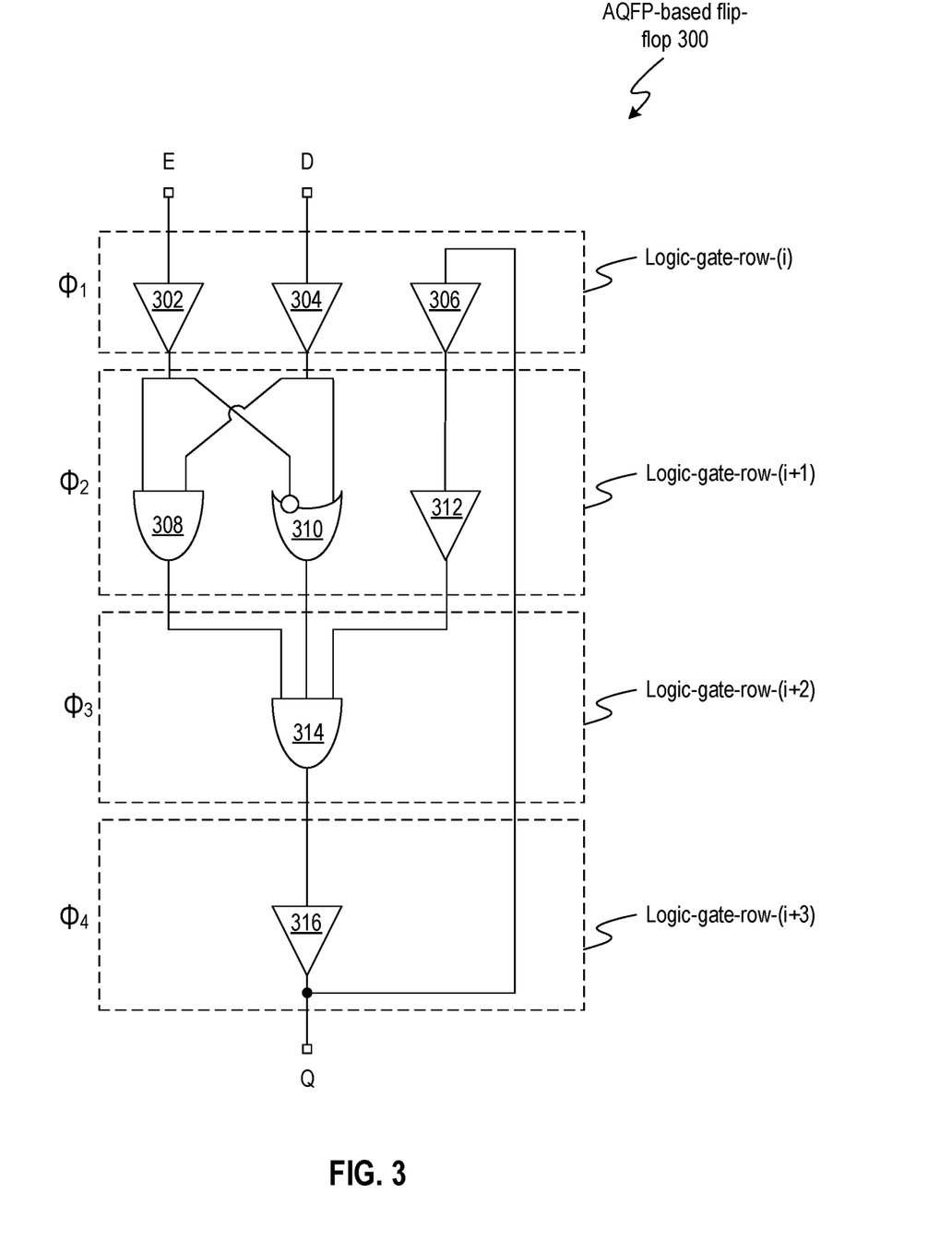
FIG. 3 illustrates an AQFP-based flip-flop in accordance with some embodiments described herein.

FIG. 3 illustrates an AQFP-based flip-flop in accordance with some embodiments described herein.

AQFP-based flip-flop 300 may include four rows of logic gates, namely, logic-gate-row-(i) through logic-gate-row-(i+3). Logic-gate-row-(i) may include buffers 302, 304, and 306. Logic-gate-row-(i+1) may include AND gate 308, exclusive-OR (XOR) gate 310, and buffer 312. The left input of XOR gate 310 may be inverted, which is shown using a circle. Logic-gate-row-(i+2) may include three-input AND gate 314, and logic-gate-row-(i+3) may include buffer 316. The output of buffer 316 may be provided as an input to buffer 306. The input of buffer 302 may be the enable input E, the input of buffer 304 may be the data input D, and the output of buffer 316 may be the data output Q.

Each row of logic gates may be clocked using a clock signal which has a different phase with respect to a reference clock signal. For example, in FIG. 3, $\phi_1$ may be a clock signal that has a 0° phase shift with respect to the reference clock signal, $\phi_2$ may be a clock signal that has a 90° phase shift with respect to the reference clock signal, $\phi_3$ may be a clock signal that has a 180° phase shift with respect to the reference clock signal, and $\phi_4$ may be a clock signal that has a 270° phase shift with respect to the reference clock signal.

Buffers 302, 304, and 306 in logic-gate-row-(i) may be clocked using a clock signal having phase $\phi_1$, AND gate 308, XOR gate 310, and buffer 312 in logic-gate-row-(i+1) may be clocked using a clock signal having phase $\phi_2$, AND gate 314 in logic-gate-row-(i+2) may be clocked using a clock signal having phase $\phi_3$, and buffer 316 in logic-gate-row-(i+3) may be clocked using a clock signal having phase $\phi_4$. The clock signal connections are not shown in FIG. 3. The number of logic rows (e.g., four rows in the example shown in FIG. 3) may be equal to an integer multiple of the clock phases (e.g., four clock phases in the example shown in FIG. 3). As shown in FIG. 3, buffer 316 in logic-gate-row-(i+3) corresponds to clock phase $\phi_4$ and provides a feedback signal to buffer 306 in logic-gate-row-(i), which may correspond to clock phase $\phi_1$.

In a standard-cell-based design paradigm, the circuit design area may be partitioned into a set of placement rows with a fixed height. Space between placement rows may be of variable height and may be used for routing connections between cells. Each cell may have the same height (which is equal to the fixed height of each placement row) but may have different widths. A network of cells that implements the functionality of the circuit may be placed in the set of placement rows. For example, when the AQFP-based flip-flop shown in FIG. 3 is placed in a circuit design area, the logic gates corresponding to each phase may be placed in consecutive placement rows of the circuit design area.

Precise delay and timing reconciliation is important in AQFP-based circuit designs that use multi-phase clocking. In a first design approach, each logic gate in the AQFP-based flip-flop may be a separate cell. In a second design approach, the contents of each logic-gate-row may be included in a separate cell. For example, cell #1 may include the logic gates in logic-gate-row-(i), cell #2 may include the logic gates in logic-gate-row-(i+1), and so forth. An important and non-obvious insight is that these design approaches do not guarantee alignment between logic gates in consecutive logic-gate-rows, which may result in an unpredictable delay (due to unpredictable routing).

Figure 4:
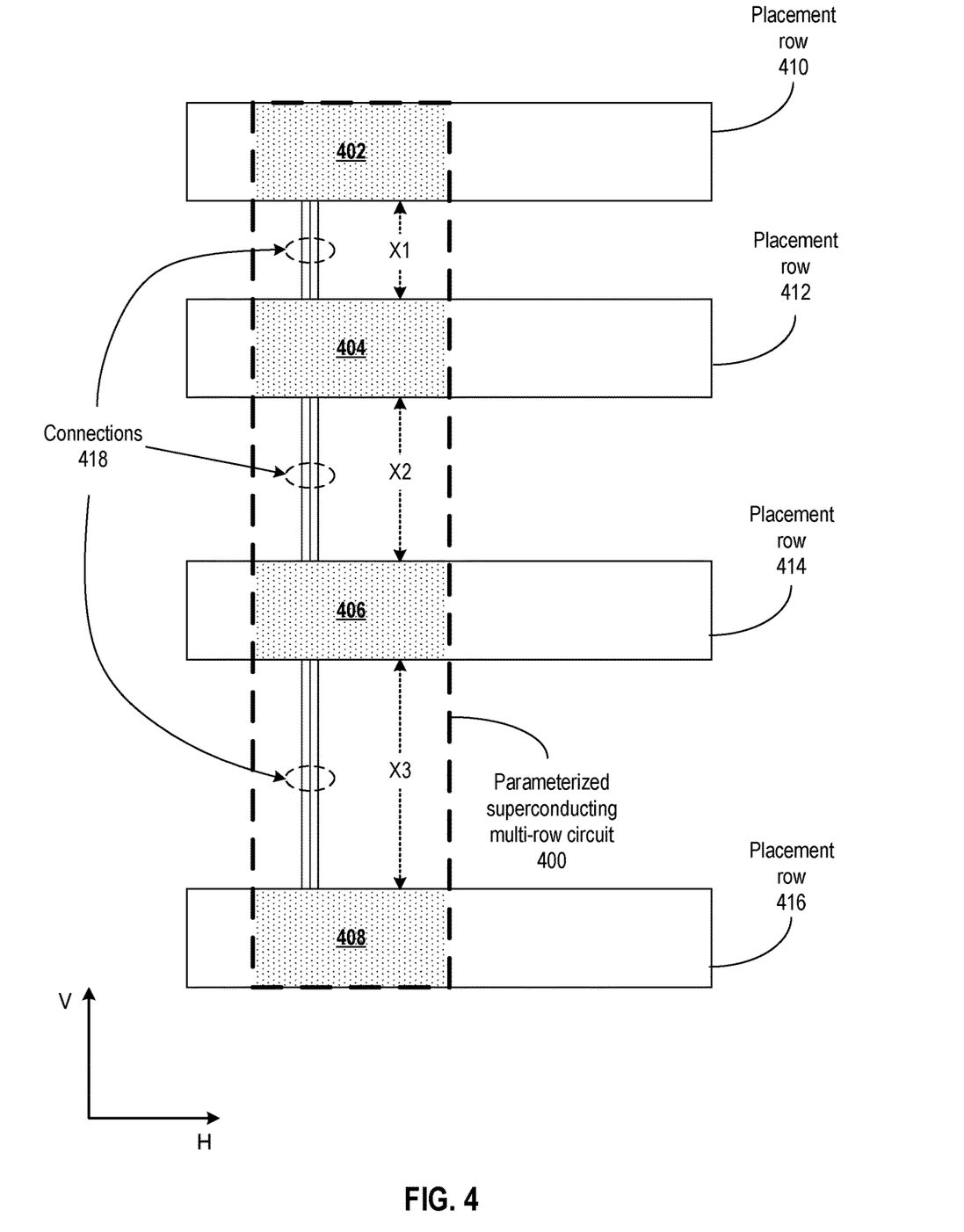
FIG. 4 illustrates a parameterized superconducting multi-row circuit in accordance with some embodiments described herein.

FIG. 4 illustrates a parameterized superconducting multi-row circuit in accordance with some embodiments described herein.

Parameterized superconducting multi-row circuit 400 may be implemented using any SCE technology, which includes, but is not limited to, AQFP technology, QFP technology, DSFQ technology, and RQL technology. Parameterized superconducting multi-row circuit 400 may include sub-blocks 402, 404, 406, and 408. Parameterized superconducting multi-row circuit 400 may be implemented using multiple rows of logic gates, and each sub-block may include the superconducting circuitry of a row of logic gates. For example, sub-block 402 may include AQFP circuitry of logic-gate-row-(i) in FIG. 3, sub-block 404 may include AQFP circuitry of logic-gate-row-(i+1) in FIG. 3, sub-block 406 may include AQFP circuitry of logic-gate-row-(i+2) in FIG. 3, and sub-block 408 may include AQFP circuitry of logic-gate-row-(i+3) in FIG. 3. Each sub-block may be clocked using a clock signal that has a different phase.

The distance between the sub-blocks may be parameterizable. For example, as shown in FIG. 4, parameterized superconducting multi-row circuit 400 may accept parameters X1, X2, and X3, which may specify the distances between sub-blocks 402 and 404, sub-blocks 404 and 406, and sub-blocks 406 and 408, respectively.

These parameters may be referred to as inter-row parameters because the parameters correspond to the distances between rows. Connections 418 between the sub-blocks may be resized based on the parameters. Specifically, the locations of sub-blocks 402, 404, 406, and 408 may be fixed with respect to each other along a direction (direction "V" in FIG. 4) which is perpendicular to the placement row direction (direction "H" in FIG. 4). The locations of the connections between the sub-blocks may also be fixed and the connection lengths may be determined based on the parameter values. Height may be measured along the "V" direction, and width may be measured along the "H" direction.

In other words, some embodiments described herein feature a parameterized superconducting multi-row circuit which may include a set of sub-blocks, where different sub-blocks are clocked using clock signals having different phases. The relative locations of the set of sub-blocks within the multi-row circuit along a first direction may be fixed, and the relative locations of the set of sub-blocks within the multi-row circuit along a second direction may be determined based on a set of inter-row parameters. Placement and routing may not change the relative timing of the signals in the parameterized superconducting multi-row circuit because the relative locations of the set of sub-blocks along a first direction is fixed.

For example, when parameterized superconducting multi-row circuit 400 is instantiated in a circuit design, the place-and-route system may use the values of inter-row parameters X1, X2, and X3 to place sub-blocks 402, 404, 406, and 408 in placement rows 410, 412, 414, and 416, respectively. Additionally, the placement tool may resize the connections 418 between the sub-blocks based on the values of inter-row parameters X1, X2, and X3. In some embodiments described herein, the parameter values X1, X2, and X3 may be integers that specify the distance between the sub-blocks in units of a routing grid pitch.

In some embodiments described herein, a base timing model may be created for parameterized superconducting multi-row circuit 400 by assuming the parameter values are zero (e.g., X1=X2=X3=0). Next, the timing of a timing model corresponding to a particular instantiation may be created by compensating the timing as a function of the parameter values. Specifically, in some embodiments described herein a first timing model may be received corresponding to a first parameterized superconducting circuit which may include a set of sub-blocks. Along a first direction, relative locations of the set of sub-blocks within the first parameterized superconducting circuit may be fixed. Along a second direction, relative locations of the set of sub-blocks within the first parameterized superconducting circuit may be determined based on a first set of parameter values. The first timing model may assume that each parameter value in the first set of parameter values is zero. A second set of parameter values may be received corresponding to a second parameterized superconducting circuit. Timing compensation values may be computed based on the second set of parameter values. The timing values for a second timing model corresponding to the second parameterized superconducting circuit may be computed based on the timing values in the first timing model and the timing compensation values.

Some embodiments described herein create each sub-block as a hard macro, in which the drive, timing, and pin locations are fixed and have been optimized for ease of routing to adjacent hard macros. Some embodiments described herein implement an AQFP-based flip-flop using a set of hard macros with fixed relative locations in a first direction (e.g., direction "H" in FIG. 4), and an adjustable spacing between the hard macros in a second direction (e.g., direction "V" in FIG. 4).

Some embodiments described herein provide a timing model of an AQFP-based flip-flop that adjusts cell timing as a function of a set of parameter values that are used for placing the sub-blocks of the AQFP-based flip-flop cell. Some embodiments described herein feature techniques for creating a set of sub-blocks as hard macros with drive, timing, and pin locations that may be optimized for routing between macros in preceding and succeeding rows. Some embodiments described herein implement a logic function (e.g., a flip-flop which implements a storage function) using a set of sub-blocks with adjustable spacing between rows to allow horizontal wiring tracks for channel routing.

Some embodiments described herein feature a timing model of the parameterized multi-row superconducting circuit (e.g., a parameterized AQFP multi-row cell) which adjusts cell timing as a function of the set of inter-row parameters.

Embodiments described herein generally apply to any logic function or macro that is implemented using a multi-clock-phase configuration. Embodiments described herein generally apply to any technology that makes use of multi-clock-phases. Although some examples in this disclosure are illustrated using four clock phases, the disclosure generally applies to circuit designs that use three or more clock phases.

Figure 5:
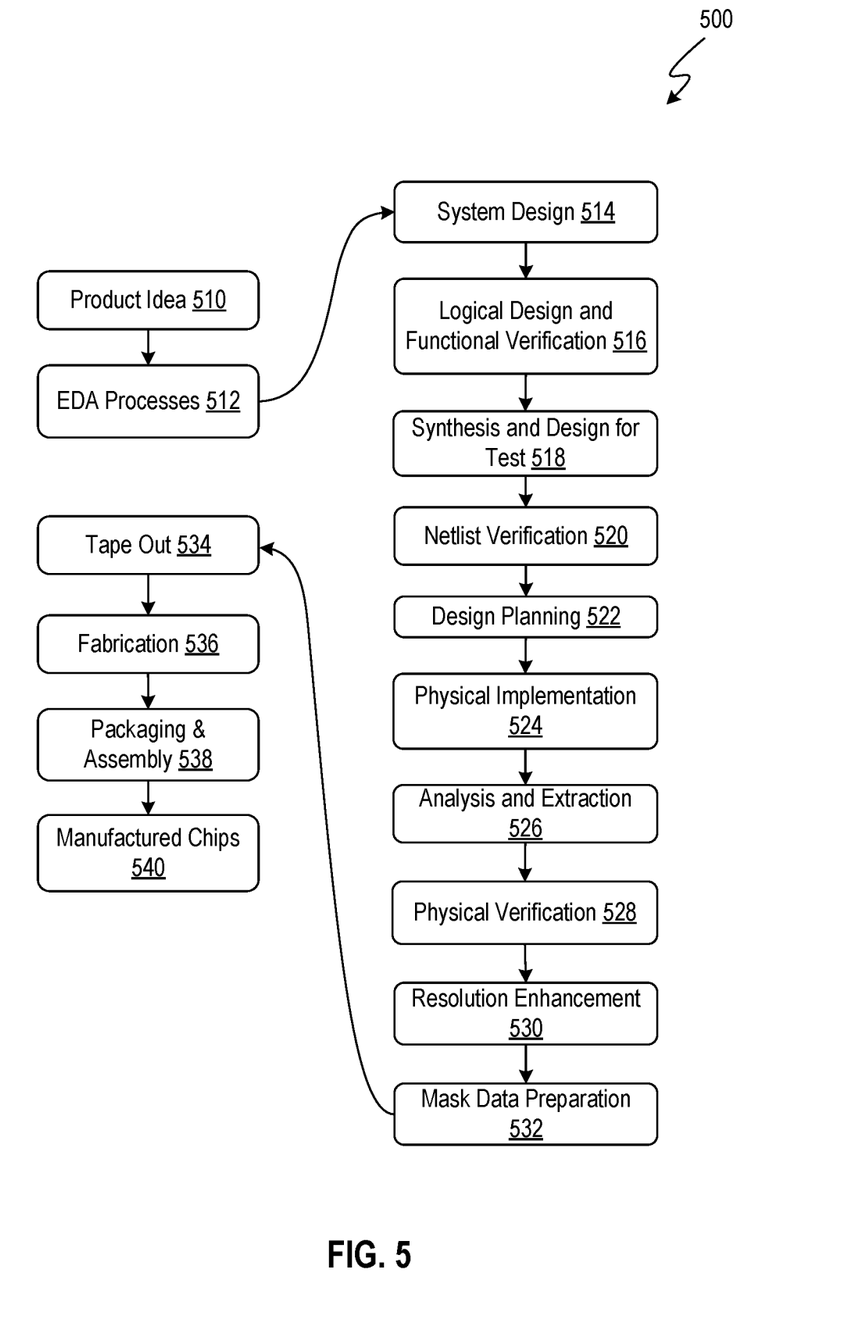
FIG. 5 illustrates an example flow for the design, verification, and fabrication of an integrated circuit in accordance with some embodiments described herein.

FIG. 5 illustrates an example flow for the design, verification, and fabrication of an integrated circuit in accordance with some embodiments described herein.

EDA processes 512 (the acronym "EDA" refers to "Electronic Design Automation") can be used to transform and verify design data and instructions that represent the integrated circuit. Each of these processes can be structured and enabled as multiple modules or operations.

Flow 500 can start with the creation of a product idea 510 with information supplied by a designer, information which is transformed and verified by using EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly 538 are performed to produce the manufactured IC chip 540.

Specifications for a circuit or electronic structure may range from low-level transistor material or superconducting material layouts to high-level description languages. A high-level of representation may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower representation level that is a more concrete description adds more detail into the design description. The lower levels of representation that are more concrete descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components which may include, but are not limited to, transistors, capacitors, and/or SCE components) and routing (connection of the circuit components by multiple conductors) occurs, and the selection of cells from a library to enable specific logic functions can be performed. As used herein, the term 'cell' may refer to a set of circuit components (which may include, but are not limited to, CMOS components and/or SCE components) and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 in FIG. 6) may be used to store the programs and data structures that are used by embodiments described herein.

Figure 6:
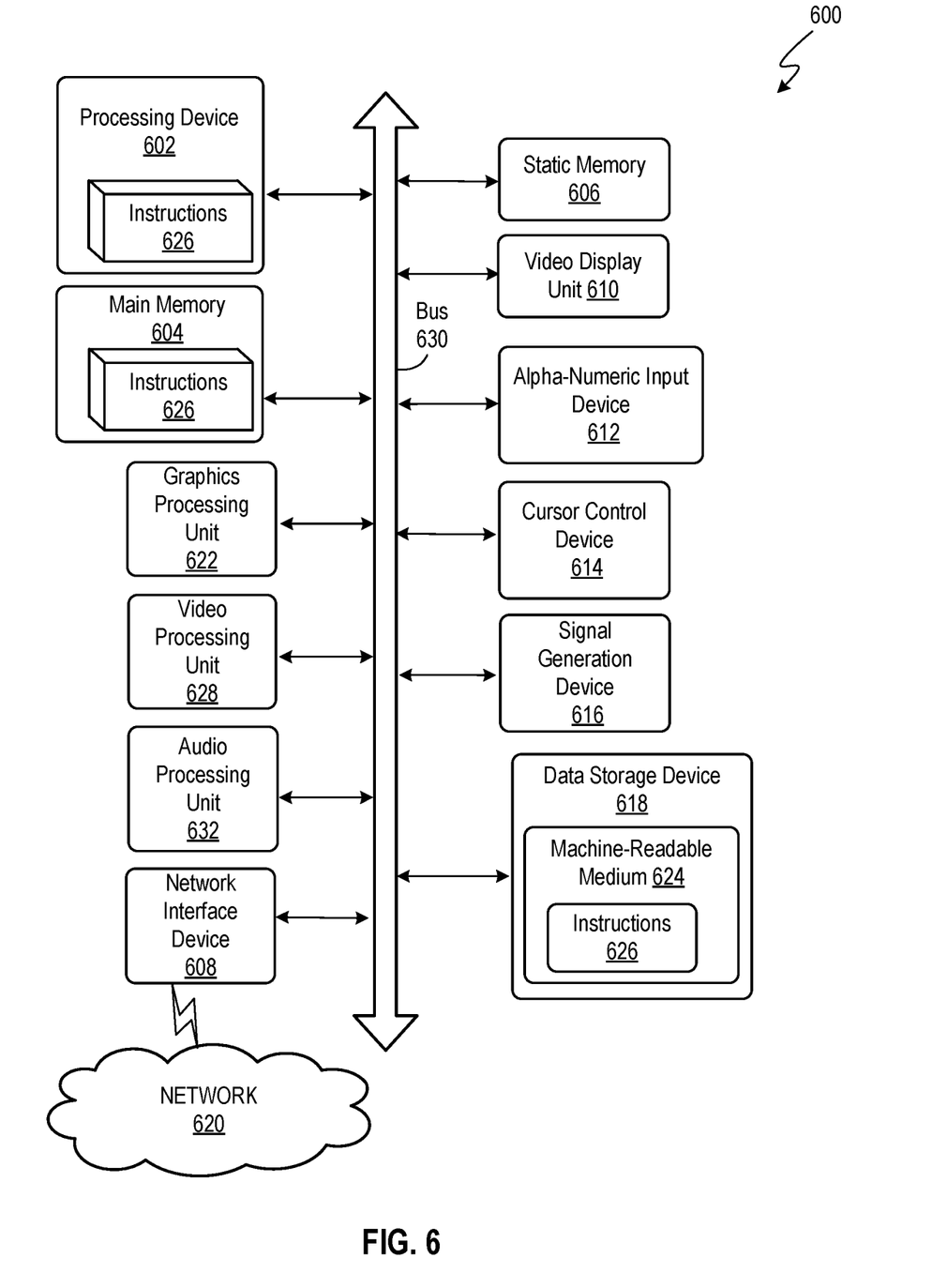
FIG. 6 illustrates an example machine of a computer system within which a set of instructions, for causing the machine to perform any one or more of the methodologies discussed herein, may be executed.

FIG. 6 illustrates an example machine of a computer system within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various design modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A parameterized superconducting circuit, comprising:
   a set of sub-blocks comprising superconducting circuitry, wherein different sub-blocks in the set of sub-blocks are clocked using clock signals having different phases;
   wherein, along a first direction, relative locations of the set of sub-blocks within the parameterized superconducting circuit are fixed; and
   wherein, along a second direction, relative locations of the set of sub-blocks within the parameterized superconducting circuit are determined based on a set of parameter values.

2. The parameterized superconducting circuit of claim 1, wherein a circuit design area which includes the parameterized superconducting circuit is partitioned into a set of placement rows, wherein each placement row has a width along the first direction and a height along the second direction, and wherein each sub-block in the set of sub-blocks is placed in a different placement row.

3. The parameterized superconducting circuit of claim 2, wherein a first parameter value in the set of parameter values corresponds to a distance between a pair of sub-blocks.

4. The parameterized superconducting circuit of claim 3, wherein lengths of connections between the pair of sub-blocks are resized based on the first parameter value.

5. The parameterized superconducting circuit of claim 1, wherein each sub-block is a hard macro.

6. The parameterized superconducting circuit of claim 1, wherein the set of sub-blocks include quantum-flux-parametron (QFP) circuitry.

7. The parameterized superconducting circuit of claim 1, wherein the set of sub-blocks include adiabatic quantum-flux-parametron (AQFP) circuitry.

8. The parameterized superconducting circuit of claim 1, wherein the set of sub-blocks include reciprocal quantum logic (RQL) circuitry.

9. The parameterized superconducting circuit of claim 1, wherein the set of sub-blocks implement a flip-flop.

10. A circuit, comprising:
    a set of placement rows, wherein adjacent placement rows are clocked using clock signals with different phases;
    a set of sub-blocks comprising superconducting circuitry;
    wherein, along a first direction, relative locations of the set of sub-blocks within the circuit are fixed;
    wherein, along a second direction, relative locations of the set of sub-blocks within the circuit are determined based on a set of parameter values; and
    wherein each sub-block in the set of sub-blocks is placed in a different placement row.

11. The circuit of claim 10, wherein the first direction is perpendicular to the second direction, wherein each placement row has a width along the first direction and a height along the second direction, and wherein the width is greater than the height.

12. The circuit of claim 11, wherein a first parameter value in the set of parameter values corresponds to a distance between a pair of sub-blocks.

13. The circuit of claim 12, wherein lengths of connections between the pair of sub-blocks are resized based on the first parameter value.

14. The circuit of claim 10, wherein each sub-block is a hard macro.

15. The circuit of claim 10, wherein the set of sub-blocks include quantum-flux-parametron (QFP) circuitry.

16. The circuit of claim 10, wherein the set of sub-blocks include adiabatic quantum-flux-parametron (AQFP) circuitry.

17. The circuit claim 10, wherein the set of sub-blocks include reciprocal quantum logic (RQL) circuitry.

18. The circuit of claim 10, wherein the set of sub-blocks implement a flip-flop.

19. A method, comprising:
    receiving a first timing model corresponding to a first parameterized superconducting circuit, wherein the first parameterized superconducting circuit comprises a set of sub-blocks, wherein, along a first direction, relative locations of the set of sub-blocks within the first parameterized superconducting circuit are fixed, and wherein, along a second direction, relative locations of the set of sub-blocks within the first parameterized superconducting circuit are determined based on a first set of parameter values, and wherein each parameter in the first set of parameter values is zero;
    receiving a second set of parameter values corresponding to a second parameterized superconducting circuit;
    computing timing compensation values based on the second set of parameter values; and
    computing timing values for a second timing model corresponding to the second parameterized superconducting circuit based on the timing values in the first timing model and the timing compensation values.

20. The method of claim 19, wherein a first parameter value in the first set of parameter values corresponds to a distance between a pair of sub-blocks.

* * * * *